(12) United States Patent
Lewis et al.

(10) Patent No.: US 7,585,549 B2
(45) Date of Patent: Sep. 8, 2009

(54) METHOD OF APPLYING A PATTERN OF PARTICLES TO A SUBSTRATE

(75) Inventors: Brian G. Lewis, Branford, CT (US); Bawa Singh, Voorhees, NJ (US); Robert H. Detig, Denville, NJ (US); Gerard R. Minogue, Yorba Linda, CA (US); Dietmar C. Eberlein, Wappingers Falls, NY (US); Kenneth Reilly, Jersey City, NJ (US); Michael Marczi, Jersey City, NJ (US)

(73) Assignee: Fry's Metals, Inc., Jersey City, NJ (US)

( * ) Notice: Subject to any disclaimer, the term of this patent is extended or adjusted under 35 U.S.C. 154(b) by 846 days.

(21) Appl. No.: 10/888,286

(22) Filed: Jul. 9, 2004

(65) Prior Publication Data

US 2005/0106329 A1    May 19, 2005

Related U.S. Application Data

(60) Provisional application No. 60/485,912, filed on Jul. 9, 2003.

(51) Int. Cl.
*B05D 3/14* (2006.01)

(52) U.S. Cl. ...................... 427/458; 427/459; 427/460; 427/468; 427/97.3

(58) Field of Classification Search ........................ None
See application file for complete search history.

(56) References Cited

U.S. PATENT DOCUMENTS

| | | | |
|---|---|---|---|
| 3,570,040 A * | 3/1971 | Back | ............................ 15/349 |
| 4,298,407 A | 11/1981 | Taylor | |
| 4,719,164 A | 1/1988 | Podszun et al. | |
| 4,857,482 A | 8/1989 | Saito et al. | |
| 5,071,517 A | 12/1991 | Oabayashi | |
| 5,110,384 A | 5/1992 | Dudek et al. | |
| 5,352,318 A | 10/1994 | Takabayashi et al. | |
| 5,376,403 A | 12/1994 | Capote et al. | |
| 5,571,455 A | 11/1996 | Higuchi | |
| 5,817,374 A | 10/1998 | Detig et al. | |
| 5,976,337 A | 11/1999 | Korinko et al. | |
| 5,981,043 A | 11/1999 | Murakami et al. | |
| 6,025,258 A | 2/2000 | Ochiai et al. | |
| 6,027,630 A | 2/2000 | Cohen | |
| 6,153,348 A | 11/2000 | Kydd et al. | |
| 6,156,237 A | 12/2000 | Kubota et al. | |
| 6,157,789 A | 12/2000 | Kamada et al. | |
| 6,337,028 B1 | 1/2002 | Masuko et al. | |
| 6,345,718 B1 | 2/2002 | Minogue | |
| 6,524,758 B2 | 2/2003 | Eberlein et al. | |
| 6,579,652 B1 | 6/2003 | Detig et al. | |
| 6,780,249 B2 | 8/2004 | Nelson et al. | |
| 6,781,612 B1 | 8/2004 | Detig | |
| 6,790,483 B2 | 9/2004 | Jagannathan et al. | |
| 2002/0018859 A1 | 2/2002 | Bednarz et al. | |
| 2002/0034617 A1 | 3/2002 | Eberlein et al. | |
| 2003/0008223 A1 | 1/2003 | Kawamura et al. | |
| 2003/0170553 A1 | 9/2003 | Eberlein et al. | |
| 2003/0210318 A1 | 11/2003 | Detig | |

FOREIGN PATENT DOCUMENTS

| | | |
|---|---|---|
| EP | 0788300 A1 | 8/1997 |
| WO | WO 02/48980 A1 | 6/2002 |
| WO | WO 02/063397 A1 * | 8/2002 |
| WO | WO 02/071465 A1 | 9/2002 |

OTHER PUBLICATIONS

Supplementary European Search Report, EP04809486, dated Jun. 17, 2009, 3 pages.

* cited by examiner

*Primary Examiner*—William Phillip Fletcher, III
(74) *Attorney, Agent, or Firm*—Senniger Powers LLP

(57) ABSTRACT

A method for applying particles in a pattern to a substrate, either directly or by use of an intermediate tool, by electrokinetic or electrostatic means by exposing the substrate to particles in a fluid medium to electrokinetically or electrostatically deposit the particles onto the substrate.

26 Claims, 14 Drawing Sheets

METHOD OF APPLYING A PATTERN OF PARTICLES TO A SUBSTRATE

FIELD OF THE INVENTION

The present invention relates to a method for producing patterned articles by deposition of powder, particles, spheres, or other materials onto a substrate.

BACKGROUND OF THE INVENTION

In a variety of applications it is desirable to apply particles to a substrate in a predetermined pattern. One such application is the formation of patterns of solder alloy on silicon wafers. The precision required to appropriately form the desired pattern renders traditional powder application methods insufficient. A typical silicon wafer substrate may have a relatively high concentration of connection points present as exposed metallization such as pads or under bump metallization (UBM) at a diameter of, for example, about 100 microns and spaced at a pitch of about 250 microns.

U.S. Pat. No. 5,817,374 discloses a process for patterning powders which employs a bed of particles, a mask, and a dielectric receptor. The dielectric receptor receives a temporary charge, which attracts the particles so they travel through the mask and adhere to the receptor in a pattern defined by the mask.

In addition, it is important to ensure that the particles are deposited in the desired pattern without irregular or stray particle distribution. Many deposition processes result in a so-called "edge effect," where there is a non-uniform band of overdeposited metal particles around the periphery of the metallization. Reducing the edge effect during deposition is desirable to provide uniformity in the final product.

Mixed-electronic component substrates allow a variety of functions to be accomplished by a single substrate, but they require varying solder bump thicknesses appropriate for the discrete components. Creating a substrate with varying thicknesses is a cumbersome process using traditional stencil printing methods because it requires a special stencil which must be cleaned after each deposition. As such, it would be desirable to develop a single-step method of creating substrates with controlled solder bump thicknesses thereon.

SUMMARY OF THE INVENTION

Among the several aspects of the invention is to provide a method and equipment for depositing particles in a pattern on a substrate.

Briefly, therefore, the invention is directed to a method for applying a pattern of particles to a substrate having masked surfaces and unmasked surfaces. The method involves applying an electrostatic charge to at least some of the masked surfaces of the substrate to yield charge-holding masked surfaces; and exposing the substrate with the charge-holding masked surfaces thereon to the particles in a fluid medium in which the particles are mobile, which particles have an electrical charge of the same polarity as the charge on the charge-holding masked surfaces, thereby electrostatically depositing the particles onto the unmasked surfaces of the substrate.

In another aspect the invention is a method involving immersing a substrate in an electrokinetic solution containing particles, wherein unmasked portions of the substrate constitute an electrode; immersing a counter-electrode in the electrokinetic solution; and attaching the electrode and counter-electrode to opposite poles of a voltage supply to establish an electrical potential between the counter electrode and the electrode and thereby electrokinetically depositing the particles on the unmasked portions of the substrate constituting the electrode.

In a further embodiment, the invention is a method of applying a pattern of particles to a substrate by applying an electrostatic charge to non-conductive areas of a patterned tool surface comprising a pattern defined by conductive areas and non-conductive areas to yield a charged patterned tool surface; exposing the charged patterned tool surface to particles in a dielectric fluid, which particles have an electrochemical charge, to thereby cause a quantity of the particles to adhere to the conductive areas on the patterned tool surface and thereby yield a patterned tool surface with particles adhered to the conductive areas; and closely exposing the patterned tool surface with particles adhered thereto to a surface of a substrate to thereby transfer at least a portion of the quantity of particles from the patterned tool surface to the surface of the substrate in a substrate pattern defined by the pattern on the patterning tool surface.

The invention further encompasses a method of applying a pattern of particles to a substrate involving applying an electrical potential to conductive areas on a patterned tool surface comprising a pattern defined by conductive areas and non-conductive areas; exposing the patterned tool surface to particles in a dielectric fluid, which particles have an electrochemical charge, to thereby cause a quantity of the particles to adhere to the conductive areas on the patterned tool surface to which the electrical potential is applied, and thereby yield a patterned tool surface with particles adhered to the conductive areas; and closely exposing the patterned tool surface with particles adhered thereto to a surface of a substrate to thereby transfer at least a portion of the quantity of particles from the patterned tool surface to the surface of the substrate in a substrate pattern defined by the pattern on the patterned tool surface.

The invention is also directed to each of the foregoing methods in situations where the substrate is an electronic device substrate, situations where the substrate is an electronic device having under bump metallization, and situations where the particles are solder metal particles.

Other aspects and features of the invention will be in part apparent, and in part described hereafter.

DETAILED DESCRIPTION OF THE INVENTION

Figure 1A:
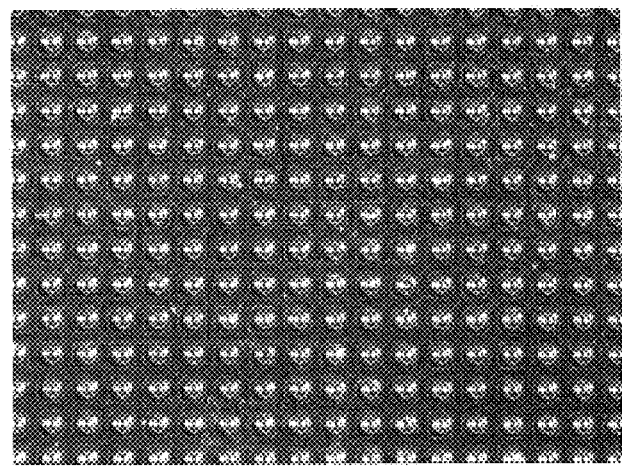
FIGS. 1A, 1B, and 1C are photomicrographs of solder bumps prepared according to the method of the invention.
Figure 1B:
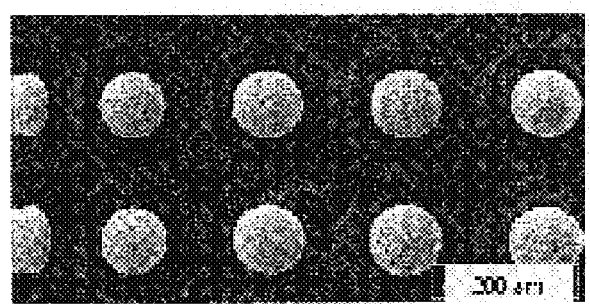
Figure 1C:
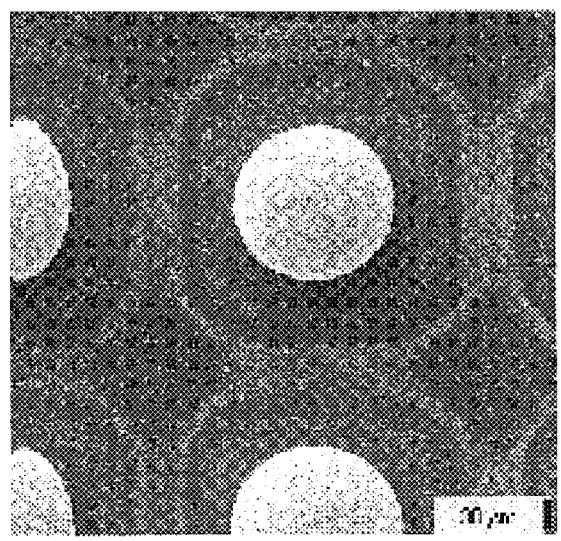

The invention involves the selective deposition of particles in a pattern on a substrate. One application is deposition of solder particles over metal interconnect features on an electronic device substrate, such as a silicon wafer substrate, to provide electrical interconnection between the substrate interconnect features and devices to be attached to the substrate. The invention is described herein in the context of solder metal particles on electronic device substrates, which particles are deposited in patterns and reflowed to yield, for example, the intermediate substrate shown in FIG. 1. The invention encompasses a number of particle deposition environments. The nature of the particles as solder metal and the nature of the substrate as an electronic device substrate are not critical to the applicability of the invention.

In a first aspect of the invention, particles are deposited in an electrostatic mode. In a second aspect, particles are deposited in an electrokinetic mode. The particles deposited range in size from micron-sized powder, to mid-sized particles, to spheres having a diameter on the order of several hundred microns to 1 mm in diameter.

Electrostatic-Based Deposition

To summarize the electrostatic-based deposition aspect of the invention, a substrate is patterned with a charge-holding mask. A corona discharge is used to charge the charge-holding mask. Charged particles in a liquid toner are transferred onto a specific site on a substrate. The charge on the mask is of the same sign (+/−) as the charge on the particles. The particles are excluded from the regions having the same charge as the particles, i.e, from the mask. The substrate acts as an electrode and is held at a potential that, when juxtaposed to the charged mask, attracts the particles. In many embodiments this potential constitutes electrical ground. In this way image definition and contrast are achieved.

Figure 2:
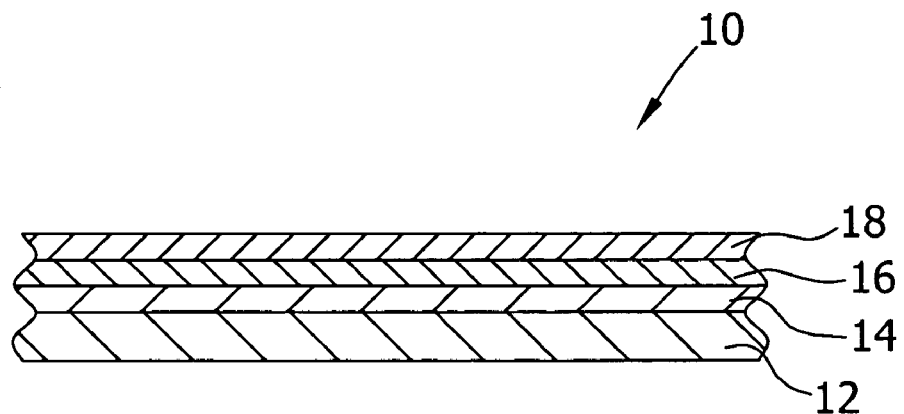
FIGS. 2-7 are schematic illustrations demonstrating preparation of a substrate to which particles are applied in accordance with this invention.

With regard to the specific process, a first step is substrate preparation. In one application for the invention, the goal of the process is to yield the product of FIG. 1, which is an electronic device substrate with individual solder bumps thereon. In this embodiment, the substrate 10 is a silicon wafer substrate overlayed by three metallization layers. In particular, as shown schematically in cross-sections in FIG. 2, an aluminum seed layer 14 is deposited directly on a silicon wafer 12, followed by a nickel-vanadium layer 16 and, finally, a copper layer 18. The Al seed layer 14 is on the order of about 0.1 micron thick, for example, between about 500 and about 2000 angstroms. The NiV layer 16 is on the order of about 500 angstroms thick, for example, between about 100 and about 1000 angstroms. The Cu layer 18 is on the order of about 1 micron thick, for example, between about 0.5 micron and about 5 micron. This is one exemplary UBM arrangement; it is not the only arrangement employed in the industry; and the arrangement itself is not critical to the invention.

The next step is to define a mask pattern on the substrate which will assist in removing the UBM down to the underlying Al in certain locations and protecting the UBM in other locations from this removal action. To this end, the substrate 10 is overcoated with a non-conductive coating which contains a photoimageable agent. This coating is selected from among acrylic-based, polyimide-based, commercially available epoxy-based PWB solder mask coatings, and a variety of commercially available organic photoimageable photopolymer coatings. One suitable polymer is a thick-film spin-on photosensitive polymer available under the designation AZPDP100XT, or novalac-based AZPLP-100, both available from Clariant of Bridgewater, N.J. Another is polystyrene-based material available under the trade designation Futurrex. This coating is between about 1 micron and about 250 microns thick for solder bumping of silicon wafers, depending on the size of the interconnect features to receive the solder particles.

Figure 3:
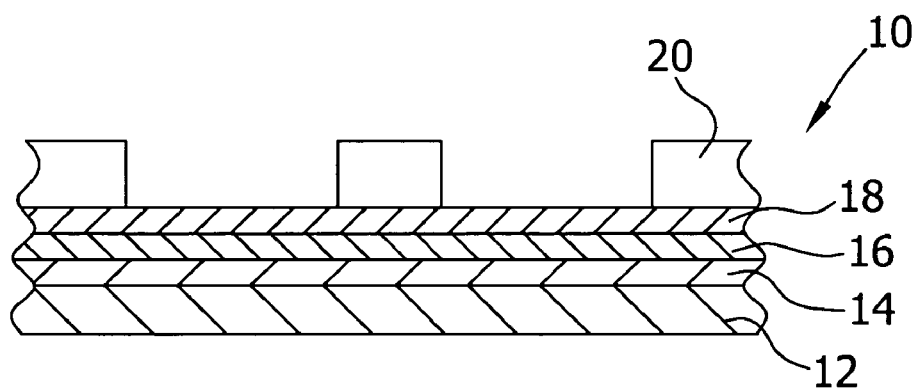

The substrate is subjected to a soft cure in, for example, a box oven. The polymer on the substrate is soft cured in the sense that it is not fully cured, but of sufficient strength to permit careful handling of the substrate without loss of the polymer. A solid mask is then aligned over the substrate for photocuring of the polymer. A pattern on the mask permits ultraviolet (UV) light through the mask to cure polymer in specified locations and blocks UV light through the mask to prevent curing in other locations. In particular, the mask blocks UV light over those locations where there are interconnect features on the substrate that are to receive solder particles. The mask permits UV light through to the substrate in other locations. After alignment of the mask, the substrate 10 is exposed to UV light through the mask to cure the polymer by cross-linking of the polymer. After photocuring, the mask is removed and the polymer is washed away from those areas at which it was not cross-linked by the photocuring. The polymer is then further cross-linked by, for example, oven curing at between about 110 C and about 150 C for about 30 minutes or more. While the foregoing describes the action of light to cure a negative photoresist material, an alternative embodiment employs a positive photoresist material. The foregoing operation yields a substrate surface as shown in FIG. 3 with continuous layers of Al 14, NiV 16, and Cu 18 thereon, and a patterned mask 20 thereover.

Figure 4:
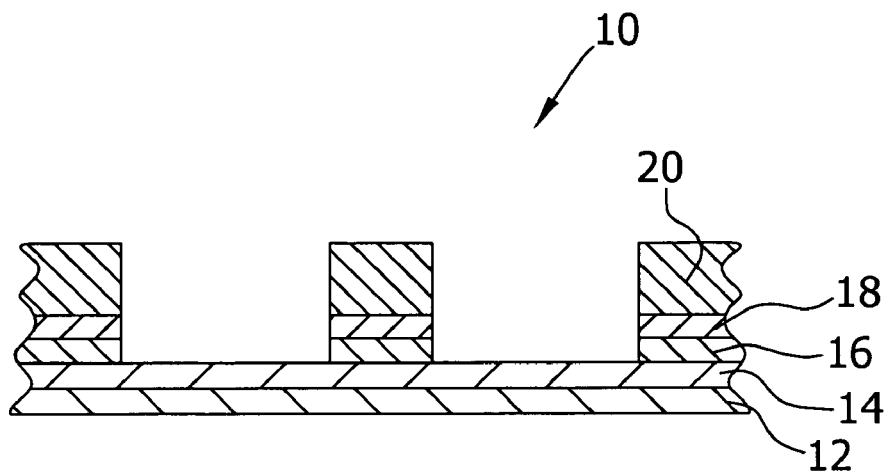
Figure 5:
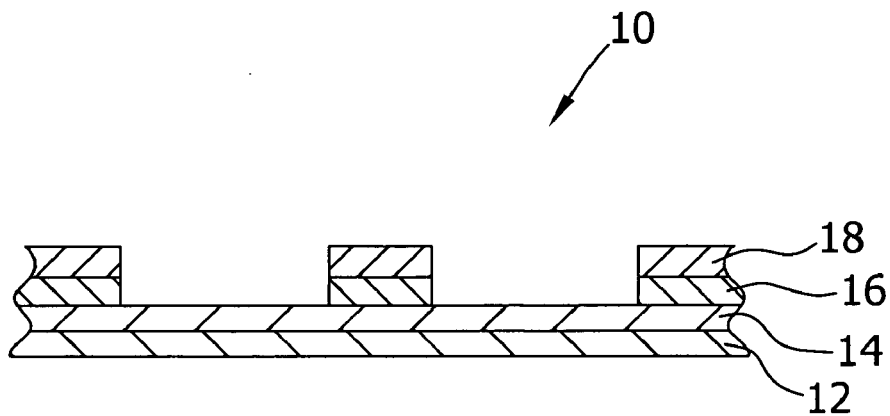

The patterned mask 20 assists in removing the UBM down to the underlying Al in certain locations and protecting the UBM in other locations from this removal action. In particular, the substrate 10 is next subjected to a wet etch process employing a chemistry which etches away the Cu and NiV, or other UBM, leaving the Al exposed. The mask protects other areas of the surface. As shown in FIG. 4, this operation yields an exposed Al surface 14 with periodic mask-topped islands. Each island consists of a NiV layer 16, a Cu layer 18, and a protecting top mask layer 20. The top mask layer 20 of each island is then removed according to the specific instructions of the polymer supplier to yield a substrate containing the original Al surface layer 14 with islands of NiV 16 and Cu 18 thereon, as shown in FIG. 5.

Figure 6:
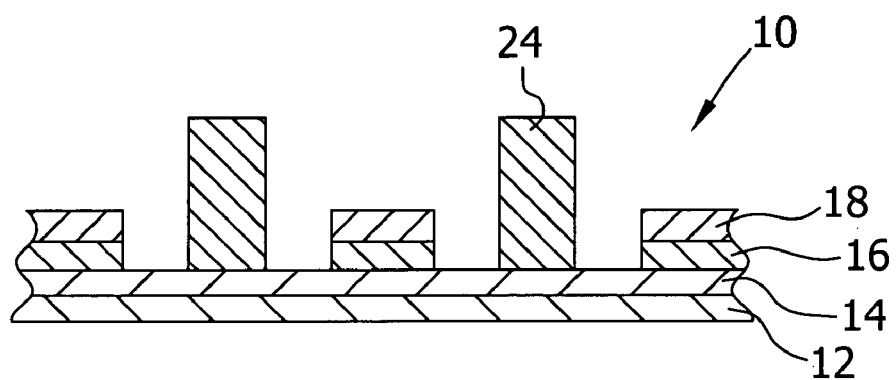
Figure 7:
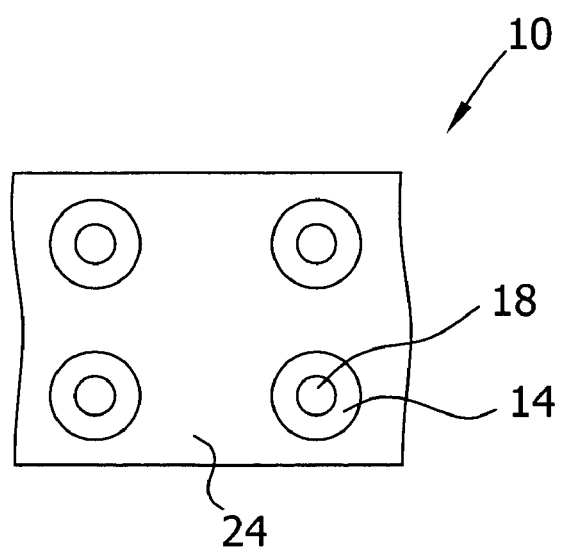

A further mask is then constructed on this substrate to provide a guide for deposition of metal particles onto the UBM islands. This mask is applied by a known technique, for example by sequentially a) spin-coating, b) UV exposure through a stencil, and c) removal of uncrosslinked mask precursor. This mask is designed such that each of its openings is larger than each respective UBM island. It is also designed to have a height that allows adequate solder volume to be deposited to form, upon reflow, a solder bump of specified size. This yields a substrate 12 containing a continuous Al layer 14 and islands of UBM 16/18 surrounded by mask material 24, with some Al exposed around each island, as shown in FIGS. 6 and 7. During eventual reflow the exposed Al around each UBM island ensures that the particles deposited thereon (as described below) are driven onto the UBM because the Al is not wetting in comparison to the UBM.

The substrate is pre-wetted with a solution containing charge director in dielectric liquid such as Isopar in order to fill the holes with diluent and prevent formation of air bubbles. This pre-wetting is accomplished by immersion, immersion plus ultrasonic activation, spray, or ultrasonic spray.

The substrate then proceeds to the particle deposition operation. A corona generator with a potential of, for example, 5 to 7 kilovolts is passed near the polymer overlayer on the substrate to impart a corona charge to the polymer mask surface. In this manner the method involves applying an electrostatic charge to at least some of the masked surfaces of the substrate to yield charge-holding masked surfaces.

Figure 8:
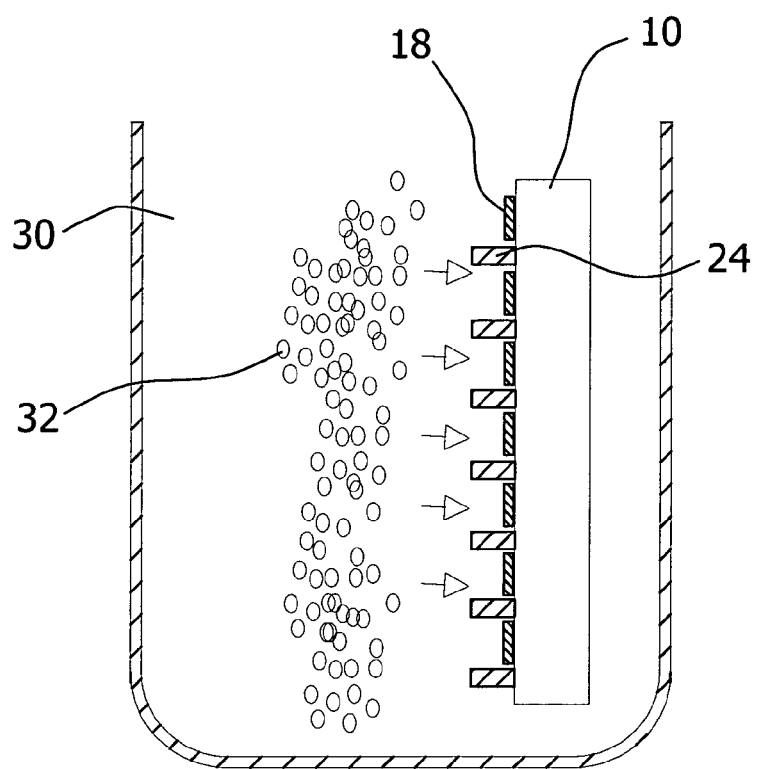
FIGS. 8-16 are schematic illustrations demonstrating electrostatic-based particle deposition in accordance with this invention.

As shown schematically in FIG. 8, in one embodiment the substrate 10 is immersed in a slurry 30 of metal particles 32 in an organic vehicle such as Fluorinert or Isopar as described herein which is agitated by air, stir bar, impeller, or otherwise. This substrate is the same substrate in FIG. 6, but is further schematically simplified in FIG. 8. A vertical orientation of the substrate in the slurry is preferred because it facilitates washing of the substrate after particle deposition. In this manner the substrate with the charge-holding masked surfaces thereon is exposed to the particles in a fluid medium in which the particles are mobile, which particles have an electrical charge of the same polarity as the charge on the charge-holding masked surfaces, thereby electrostatically depositing the particles onto the unmasked surfaces of the substrate.

The substrate is secured in a chuck (not shown) and the metallization is electrically connected such that it is held at a potential that attracts the particles. This potential may be positive, negative, or zero (ground). Its absolute value (positive, negative, or zero) is not as important as its relative value. Its value relative to the charge on the particles and the charge on the mask is such that the particles prefer to deposit on the metallization rather than on the mask. For example, if the charge on the particles 32 is positive and the corona charge on the mask 24 is positive, the substrate metallization may be ground or a negative potential may be applied. If a positive or negative potential is applied, the Al is considered to be an electrically driven backplane.

The agitated coated particles 32 are attracted to holes in between the polymer mask build-up 24 and onto the UBM 18, thereby creating solder particle deposits of the coated metal particles in contact with the interconnect features. In particular, the coated particles are repelled from the corona charged mask overlayer and are attracted to the areas which are held at ground or a potential that attracts the particles. This attraction is facilitated because the particles are coated in advance with electrically polar materials to create a chemical charge thereon. This chemical charge is then preferentially attracted to the UBM metallization 18, i.e., the interconnect features, rather than to the like-charged mask 24. The chemical charge on the particles is positive or negative depending on whether its pretreatment coating was either acidic or basic in functionality. The particles are directed down into the holes in the mask along electrical field lines generated by the electrical charge on the raised polymer overlayer 24. The particles deposit on the UBM 18.

After an appropriate dwell time, the substrate is removed vertically or at some angle such that it is not parallel to the top surface of the solution. In one preferred embodiment, the substrate is at an angle of between about 15 and about 75 degrees from vertical during removal.

As an alternative to full immersion of the substrate in the slurry, exposure of the substrate to the solution may be accomplished by flowing the metal particle solution across the top of the substrate. In one embodiment, this is accomplished by placing the substrate adjacent a vessel of the metal particle solution. The substrate is preferably skewed relative to the solution to facilitate flow of the solution across and off of the substrate. In one embodiment, the substrate is at an angle relative to vertical of between about 30 and about 60 degrees. There is a conduit leading out of the vessel through which the solution flows onto the substrate and then flows across the substrate.

In each of the various embodiments of the invention, there is preferably an agitating propeller in the bottom of the vessel to help maintain the particles in suspension. In one embodiment the propeller rotates for about five seconds in a counterclockwise direction and then reverses to rotate for about five seconds in a clockwise direction. This is continually repeated to provide constant agitation. The rotation speed in this embodiment is on the order of about 750 rotations per minute.

Vibration of the substrate has been found to be advantageous in certain instances during the particle deposition operation. In one embodiment, the substrate is vibrated at the conclusion of each individual stage of deposition. For example, if the substrate undergoes three stages of particle deposition, the substrate is vibrated at the conclusion of each particle deposition stage. Vibratory energy is provided by a suitable source such as, for example, a mechanical source, a magnetic source, or a piezoelectric source. Mechanical vibration energy is transmitted to the substrate via the substrate chuck. If magnetic or piezo forces are employed, they are transmitted to the substrate via a transducer. This vibratory action has been discovered to help the particles settle more densely onto the metallization without pinching off or voiding. The duration of the vibration stage varies from about 1 second to several seconds. The amplitude of vibration is on the order of a few microns. In one embodiment, the amplitude is in the range of about 1 to about 10 microns. The frequency of the vibration is on the order of kilohertz. In one embodiment, the frequency is in the range of about 5 to 20 kHz. The vibratory energy in one embodiment is in the range of about 0.1 to about 10 watts. Without being bound to a particular theory, it is thought that the vibration breaks or overcomes an electrostatic charge between particles in a column. Another theory is that the vibration breaks or overcomes frictional force between particles in a column.

In an optional embodiment of the invention, the particle deposition stage may involve deposition of the particles in a stepwise manner to obtain a more dense deposit without pinching off or voiding. In particular, this involves a first deposition employing a relatively low corona charge, a second deposition employing a relatively moderate corona charge, and a third deposition employing a relatively high corona charge. For example, a first pass imparts a corona charge in the range of about 100 to about 500 V to the mask; a second pass employs a corona charge in the range of about 200 to about 700 V; and a third pass employs a corona charge in the range of about 500 to about 1000 V. These three iterations may correspond roughly to three deposition phases involving a) filling of the bottom of the recesses; b) filling the recesses up to their tops, even with the top of the non-conducting layer; and c) overfilling on top of the already deposited particles. Other embodiments employ a variation in the number of iterations other than three, ranging from two to several. This stepwise deposition appears to help densify deposition and reduce voiding and pinching off. In this manner, therefore, the invention involves, after exposing the substrate to the particles, repeating the step of applying the charge to regenerate charge on the masked surfaces, and repeating the step of exposing the substrate to the particles to deposit additional particles onto the particles onto the unmasked surfaces of the substrate.

Without being bound to a particular theory, it is believed that during the early deposition of metal particles on the deepest feature of the substrate, a relatively weaker electrical field results in fewer particles being attracted to the metallization than if the electrical field is stronger, reducing the chance of crowding too many particles into the feature in a short period of time. If the electrical field is stronger initially, particles may aggressively crowd into the feature and pinch off the recesses' opening to the metallization or result in excessive voiding. The weaker electrical field moves the particles less aggressively such that they can tightly pack onto the metallization without numerous particles being forced to simultaneously enter recesses in the non-conducting layer. By analogy, more passengers can enter a train car if they do not all approach the door at once, because if there is overcrowding at the door entry can be pinched off.

In yet another alternative embodiment, there are a number of iterations between two and several, such as three, and each involve a corona charge of similar magnitudes. The purpose of imparting a fresh corona charge with each iteration is to compensate for losses in corona charge due to dissipation of the charge during deposition. In particular, the electrical conductivity of the solution causes some of the charge to gradually dissipate. In one example, a corona charge of about 800 volts is imparted in three separate iterations prior to and at intervals during deposition.

After deposition the substrate is optionally washed by brief immersion in a rinse solution, with the mask openings containing the deposited particles facing down. This can also be accomplished by in-situ washing in the same vessel as the deposition, which involves simultaneous removal of the slurry and replacement with particle-free diluent.

Figure 9:
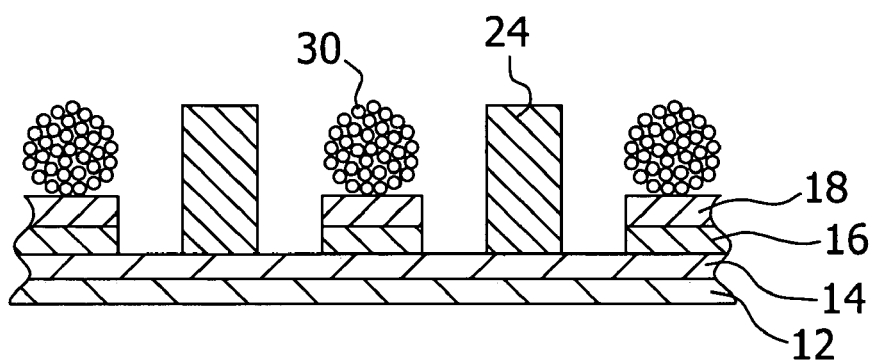
Figure 10:
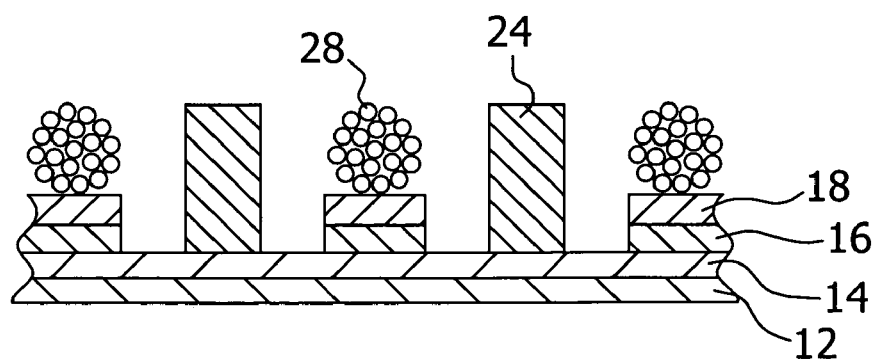
Figure 11:
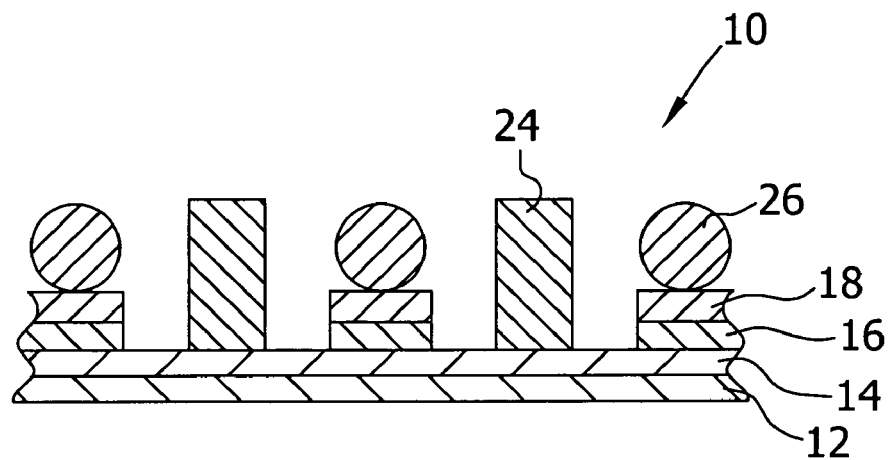

After the solder particles are deposited onto the metallization layer of the substrate, and the substrate is removed from the slurry if the full immersion embodiment is used, residual solvent is dried off by exposing the substrate to an elevated temperature. This temperature is typically in the range of 30 C to 60 C, depending on the nature of the solvent in the slurry. This yields the substrate with solder particles 30 thereon as illustrated in FIG. 9. FIG. 10 illustrates the substrate where the particles deposited are medium-sized solder particles 28 rather than smaller powder particles 30 of FIG. 9. And FIG. 11 shows the substrate where the deposit is solder spheres 26 rather than powder 30 or particles 28.

The solder is then reflowed by placement in, for example, a standard multizone solder reflow oven or, preferably, a low oxygen (<100 ppm, more preferably <20 ppm) reflow oven. It is preferred that the substrate be heated from below. During reflow, the coating on the metal particles functions as a flux. Auxiliary fluxing such as with a sprayed-on liquid flux can also be used to aid reflow.

Figure 12:
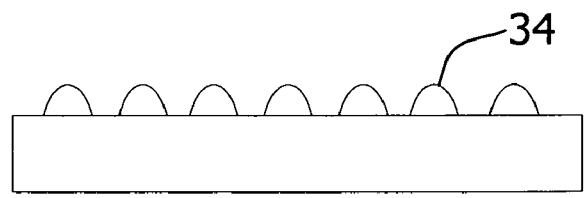

The mask is removed per the specific manufacturer's instructions for the mask material, such as by dissolution in a basic solution. This yields the substrate with solder bumps 34 thereon as illustrated schematically in FIG. 12 and in the photograph in FIG. 1.

Figure 13:
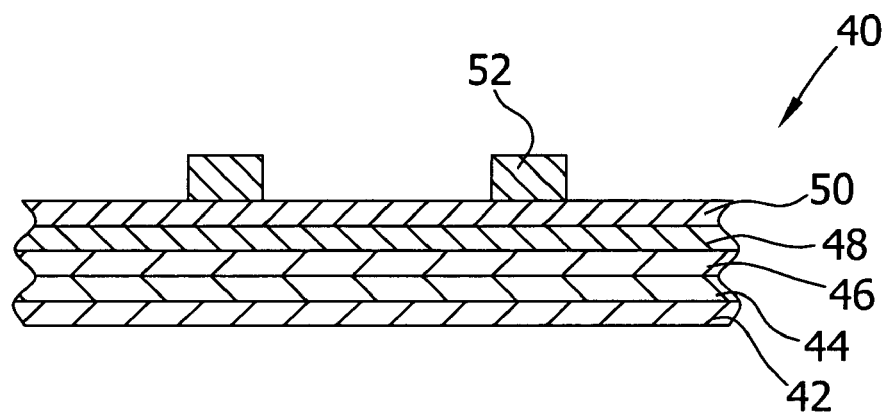
Figure 14:
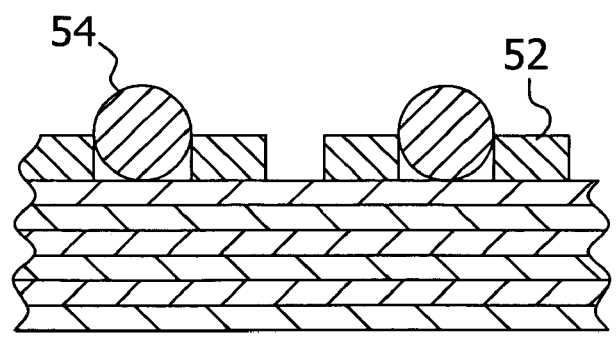
Figure 15:
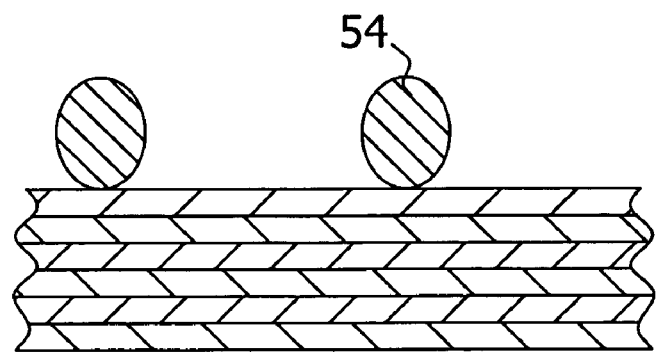
Figure 16:
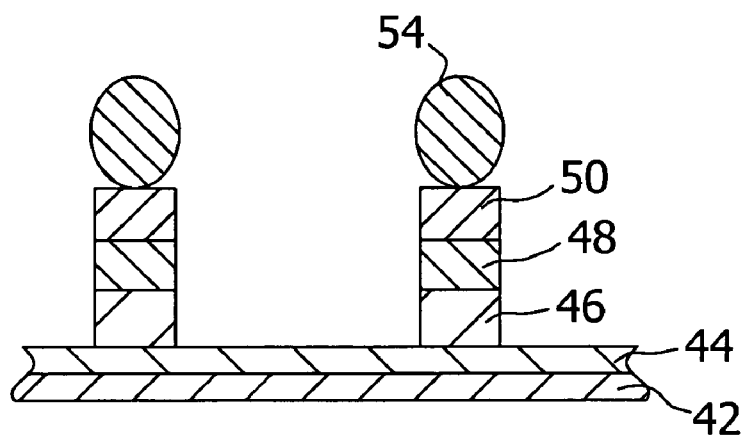

An alternative deposition process within the scope of the invention employs only a single mask rather than two masks as in the method described above. In this embodiment metal solder spheres having an average diameter of at least about 100 microns, such as between about 100 microns and about 1 mm are employed rather than smaller particles or powder. A mask 52 is formed by conventional photolithographic techniques on top of an unpatterned continuous UBM consisting of metal layers 44, 46, 48, and 50 on top of a wafer substrate 42 as shown in FIG. 13. Metal spheres 54 are electrostatically deposited onto the UBM exposed through the mask openings by the method of the invention as described above. The nature of the deposit being solid spheres facilitates their registration in the openings, even though the openings are shallower than the sphere height. The deposited spheres are held in place like an egg in an egg cup, or like a golf ball on a golf tee. The spheres are subsequently reflowed, and the mask 52 is removed to yield the solder bumps 54 in FIG. 15. Thereafter, the UBM material layers, other then the UMB material under the reflowed particles, are removed by conventional dissolution and/or wet etching techniques to yield the substrate shown in FIG. 16.

The foregoing methods of the invention are suitable for depositing metal particles of a broad range of sizes. In one approach the particles are powder, typically with an average particle size between about 2 and about 100 microns. In another approach they are mid-sized particles, such as having an average particle size between about 50 and about 500 microns. In another approach they are relatively large spheres, such as having an average diameter of at least about 100 microns, such as between about 100 microns and about 1 mm. An advantage of spheres is that they are 100% dense, in contrast to on the order of 50% dense for powder. Also, spheres can be deposited at a finer pitch than can volumes of powder because a sphere is better defined than an equal volume of powder, and because a smaller sphere can be used to yield the same amount of solder, after reflow, as a larger volume of powder. Spheres also facilitate the above-described single mask technique where the mask holes are much shallower than the deposit height.

Electrokinetic-Based Deposition

To summarize this aspect of the invention, a substrate is patterned with a mask and immersed in a suspension of particles to be deposited, similar to in the electrostatic-based process described above. In electrokinetic mode, however, the substrate serves as an electrode, and there is an immersed counter-electrode adjacent the substrate. A potential is applied between the two electrodes to drive the charged particles to the substrate. The suspension properties are engineered to provide the correct liquid phase conductivity and particle charge-to-mass ratio. Image contrast is obtained because the particles are attracted to the potential on the substrate and are not attracted to the mask. A charge on the mask builds up due to migration of charge carriers through the electrolyte to the mask material.

The specific procedures in electrokinetic-based deposition are the same as in electrostatic-based deposition in many respects, with one difference being that in electrostatic mode a primary driving force for deposition is the repulsion of charged particles away from the oppositely charged corona charge on the mask, but in electrokinetic mode the driving force is a combination of attraction of the charged particles to the oppositely charge electrical pole of the potential applied to the substrate and repulsion from the mask that receives an induced charge of the same sign as that of the particles. The substrate in electrokinetic mode is attached to an electrical connection to apply an electrical potential between the metallization and the counter-electrode. The substrate is immersed in the particle slurry (electrokinetic solution) with the unmasked portions of the substrate constituting an electrode. A counter-electrode is also immersed in the slurry to complete an electrical circuit. A vertical orientation of the substrate to the top surface of the slurry is preferred.

Figure 17:
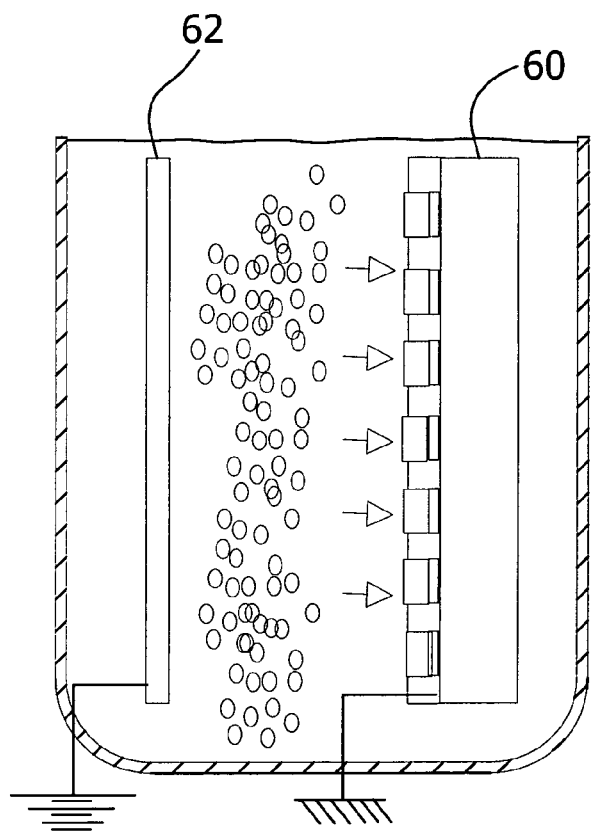
FIG. 17 is a schematic illustration demonstrating electrokinetic-based particle deposition in accordance with this invention.

An electrical potential with the metallization being the positive pole is applied between the metallization and the counter-electrode in the instance where the particles are treated to have a negative chemical charge. Alternatively, an electrical potential with the metallization being the negative pole is imparted to the metallization in the instance where the particles are treated to have a positive charge. The immersed substrate 60 and counter-electrode 61 with electrical potential applied thereto are illustrated schematically in FIG. 17. For example, the negative terminal of the circuit is attached to a counter-electrode plate in the slurry and the positive terminal is attached to the metallization. Or a positive terminal of the circuit is attached to a counter-electrode plate in the slurry and the negative terminal is attached to the metallization.

The charged particles in the slurry are attracted to the metallization, which is established as a terminal of polarity opposite to the charge on the particles. The charged particles move through the electrical field generated by the electrical potential between the substrate metallization and the counter-electrode. With the electrode and counterelectrode attached to opposite poles of the voltage supply establishing an electrical potential between them, the particles are electrokinetically deposited on the unmasked portions of the substrate constituting the electrode. In this embodiment there is no need to apply the corona charge to the mask. The mask acts as a mechanical and electrostatic barrier. Electrostatic charge builds up on the mask due to carrier flow through the electrolyte, which shapes an electrical field, which electrically propels charged particles into holes in the mask.

This method involves a single deposition step with an AC potential of, e.g., 50+/−50 V to 500+/−500 V. An alternative embodiment involves varying the electrical potential applied between the metallization and the counter-electrode to cause deposition. In one embodiment, this involves sweeping or ramping of a voltage slowly upward during all or less than all of the deposition. In another embodiment this involves increasing the potential in a more stepwise fashion. For example, it involves achieving a first period of the deposition at a potential between about 50+/−50 V and about 500+/−500 V; and a second and third period of the deposition at a potential between about 200+/−200 V and about 300+/−300 V. These three iterations correspond roughly to three phases of deposition involving a) filling of the bottom of the recesses; b) filling the recesses up to their tops, even with the top of the non-conducting layer; and c) overfilling on top of the already deposited particles. Other embodiments employ a variation in the number of iterations other than three, ranging from two to several. This stepwise deposition appears to provide more dense deposition and less voiding or pinching because the filling of the mask holes is more orderly.

With regard to other parameters of the deposition process, the potential is applied as a sine wave or, more preferably, as saw tooth wave. The frequency is between about 10 and 1000 Hz, preferably between about 50 and 500 Hz, more preferably between about 75 and 150 Hz. The time period for the deposition is in the range of about 2 to about 30 seconds, such as in the range of about 5 to about 20 seconds or, for one specific embodiment, in the range of about 8 to about 15 seconds. The distance between the substrate and the counter-electrode is between about 5 and about 6 mm in one embodiment. As a general proposition, this distance is between about 3 and about 10 mm, most typically between about 4 and about 7 mm.

Without being bound to a particular theory, it is believed that during the early deposition of metal particles on the deepest feature of the substrate, a relatively weaker electrical potential results in fewer particles being attracted to the metallization than if the electrical potential is stronger, reducing the chance of crowding too many particles into the feature in a short period of time. If the electrical potential is stronger initially, particles may aggressively crowd into the feature and pinch off the recess openings to the metallization or result in excessive voiding. The initially weaker electrical potential moves the particles less aggressively such that they can tightly pack onto the metallization without numerous particles being forced to simultaneously enter recesses in the non-conducting layer.

After the appropriate dwell time, the substrate is removed vertically or at some angle such that it is not parallel to the top surface of the solution. In one preferred embodiment the substrate is at an angle of between about 15 and about 75 degrees from vertical during removal. Vibration of the substrate as described above in connection with the electrostatic mode has also been found to be advantageous in connection with the electrokinetic mode.

After deposition the substrate is optionally washed by brief immersion in a rinse solution, with the mask openings containing the deposited particles facing down. This can also be accomplished by in-situ washing in the same vessel as the deposition, which involves simultaneous removal of the slurry and replacement with particle-free rinse solution.

The substrate may then optionally be subjected to a corona charge to impart an electrostatic clamp on the deposited particles. In particular, a corona generator with a potential of, for example, 5 to 7 kilovolts is passed over the substrate to impart a corona charge. This helps hold the particles in place because of the electrostatic forces applied to the mask.

Residual solvent is dried off by exposing the substrate to an elevated temperature, typically in the range of 30 C to 60 C, depending on the nature of the solvent in the slurry. This yields a substrate of the type as illustrated in FIG. 9 with solder powder particles thereon.

The solder is then reflowed by placement in, for example, a standard multizone solder reflow oven or, preferably, a low oxygen (<100 ppm, more preferably <20 ppm) reflow oven. It is preferred that the substrate be heated from below. During reflow, the coating on the metal particles functions as a flux. Auxiliary fluxing such as with a sprayed-on liquid flux can also be used to aid reflow.

The mask is removed per the specific manufacturer's instructions for the mask material, such as by dissolution in a basic solution. This yields the substrate with solder bumps thereon as illustrated schematically in FIG. 12 and in the photograph in FIG. 1.

Indirect Electrostatic Deposition Using Printing Tool

In a further variation of the invention, a separate printing tool is used which defines the pattern in which the particles are to be transferred to the substrate. This printing tool is an insulating support having a flat surface with a conductive layer thereon. An exemplary printing tool is constructed from a material such as polyimides and epoxies, has a thickness between about 1 and about 200 microns, and tool surface dimensions ranging from about 1 cm to about 100 cm in diameter. In one preferred embodiment the conductive base layer is indium-tin-oxide deposited by sputter coating onto glass or a PET film. Other conductive base layers may be Al, Ti, Pt, TiW, Au, Ni, or Cu, for example. Alternatively to sputter coating, the base layer may be deposited by electrolytic, electroless, or other metallization techniques.

A pattern is formed on the flat surface of the tool by overcoating the conductive layer with a non-conducting coating which contains a negative or positive photoimageable agent. This coating is selected from among acrylic-based dry film, photoimagable polyimides, commercially available PWB solder mask coatings, and a variety of commercially available organic photoimageable photopolymer coatings. One suitable polymer is a thick-film spin-on photosensitive polymer available under the designation AZPDP100XT, or novalac-based AZPLP-100, both available from Clariant of Bridgewater, N.J. Another material is epoxy-based SU-8 available from MCC of Newton, Mass. Another is polystyrene-based material available under the trade designation Futurrex. The photosensitive coating is exposed to UV light and developed to provide a non-conducting pattern on the printing tool.

Figure 18:
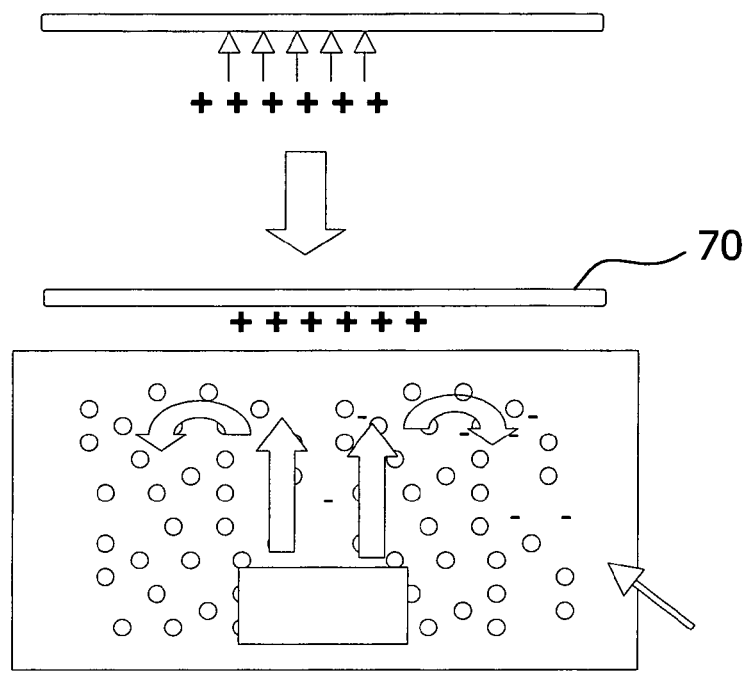
FIGS. 18-19 are schematic illustrations demonstrating use of a printing tool in accordance with this invention.

The non-conducting pattern on the printing tool is corona charged by passing a corona generator or wire with a charge of about 6000 VDC (+/−200) in close proximity to the flat surface of the tool. In this manner the invention involves applying an electrostatic charge to non-conductive areas of the patterned tool surface comprising a pattern defined by the conductive areas and non-conductive areas, which yields a charged patterned tool surface. The tool substrate is connected to electrical ground to ground the conducting layer on the tool. The tool 70 with the capacitively charged pattern is presented to the particle and liquid mixture (FIG. 18). The tool is flooded with the particle and liquid mixture such that the particles are taken up on portions of the tool on which the ground conductive base layer is exposed, as opposed to those portions on which the conductive base layer is masked with the non-conducting polymer carrying the capacitive charge imparted by the corona generator. The particles are directed along the electrical field lines down into the holes in the non-conducting pattern, which field lines are generated by the corona charge on the non-conducting pattern. In this manner the charged patterned tool surface is exposed to particles in a dielectric fluid, which particles have an electrochemical charge, to thereby cause a quantity of the particles to adhere to the conductive areas on the patterned tool surface and thereby yield a patterned tool surface with particles adhered to the conductive areas. Any loose particles are rinsed from the tool by an application of pure dielectric liquid vehicle. This method is particularly successful in working with metal spheres having an average diameter of at least about 100 microns, such as between about 100 microns and about 1 mm.

The silicon wafer or other substrate is prepared by prewetting with a dielectric liquid. The substrate is attached to a thoroughly grounded support.

Figure 19:
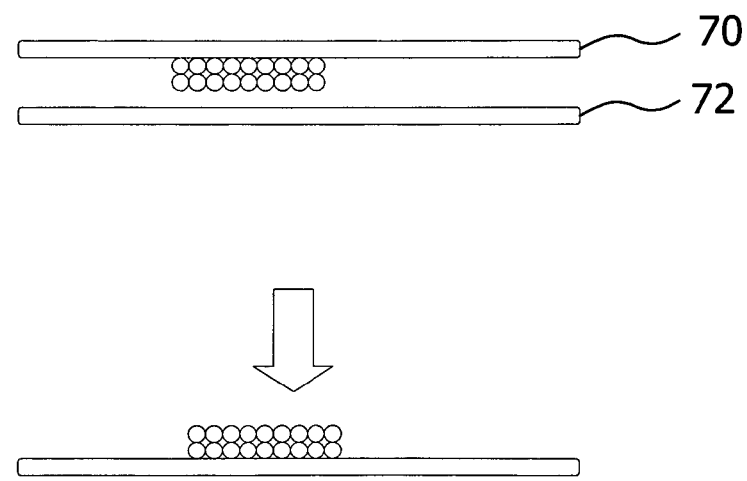
Figure 20:
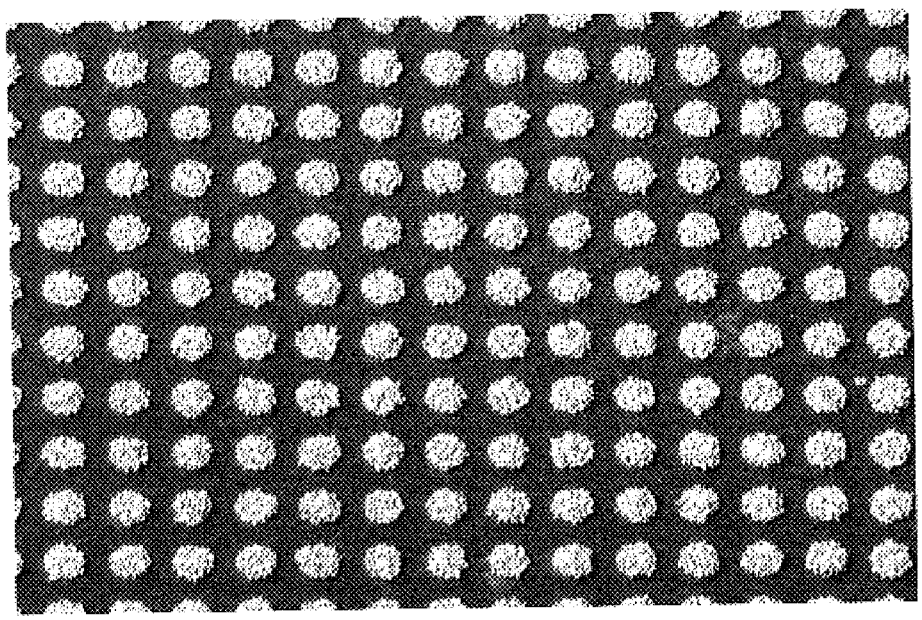
FIG. 20 is a photomicrograph of solder particles deposited on a substrate in accordance with this invention.

Transfer of the particles from the tool to the substrate involves closely exposing the patterned tool surface with particles adhered thereto to a surface of a substrate to thereby transfer at least a portion of the quantity of particles from the patterned tool surface to the surface of the substrate in a substrate pattern defined by the pattern on the patterning tool surface. To accomplish this in one embodiment, in particular, the charged and rinsed tool which is held at a voltage close to that of the charged mask is placed over the substrate surface to be patterned, with a gap of between 20 and about 300 microns separating the substrate from the tool surface (FIG. 19). The voltage on the substrate is now switched to near zero volts; due to the lower charge potential of the substrate as compared to the tool, the particles transfer to the substrate, retaining the same pattern they defined on the tool surface.

The dielectric liquid is then evaporated from the substrate. The solder is melted and fused to the substrate by conventional solder reflow technology involving, for example, baking the substrate in an oven to heat the substrate and solder to a reflow temperature.

Indirect Electrokinetic Deposition Using Printing Tool

This mode differs from the electrostatic mode in that an electrical potential of positive or negative potential is applied to the conductive layer on the tool, which will attract negatively or positively charged particles respectively. Accordingly, an electrical potential is applied to conductive areas on a patterned tool surface comprising a pattern defined by conductive areas and non-conductive areas. The non-conductive pattern on the tool is not charged. The tool is flooded with, or optionally immersed in, the particle and liquid mixture such that the particles are deposited into openings in the conductive layer on which the conductive base layer with electrical potential is exposed, as opposed to onto those portions on which the conductive base layer is masked with the non-conducting polymer. In this manner the patterned tool surface is exposed to particles in a dielectric fluid, which particles have an electrochemical charge, to thereby cause a quantity of the particles to adhere to the conductive areas on the patterned tool surface to which the electrical potential is applied, and thereby yield a patterned tool surface with particles adhered to the conductive areas. Loose particles are rinsed from the tool by an application of pure dielectric liquid vehicle.

The silicon wafer or other receiving substrate is prepared by prewetting with a dielectric liquid. The substrate is attached to a thoroughly grounded support.

Transfer to the substrate is accomplished by closely exposing the patterned tool surface with particles adhered thereto to a surface of an electronic device or other substrate to thereby transfer at least a portion of the quantity of particles from the patterned tool surface to the surface of the substrate in a substrate pattern defined by the pattern on the patterned tool surface. To accomplish this in one embodiment, the charged and rinsed tool is placed over the substrate surface to be patterned, with a gap of between about 20 microns and about 300 microns separating the substrate from the tool surface. Due to the lower charge potential of the substrate as compared to the tool, the particles transfer to the substrate, retaining the same pattern they defined on the tool surface.

The dielectric liquid is then evaporated from the substrate. The solder is melted and fused to the substrate by conventional solder reflow technology involving, for example, baking the substrate in an oven to heat the substrate and solder to a reflow temperature.

FIG. 19 illustrates depositions of Sn/Pb powder on an organic photoconductor (OPC) tool by the method described above under Indirect Electrostatic Deposition Using Printing Tool.

Particle Characteristics

In accordance with this invention, a large variety of particles for a large variety of applications are deposited. As noted above, these range from powder to mid-sized particles to spheres.

In one example, the particles are a solder powder having an average size between about 1 micron and about 100 microns. In one preferred embodiment, the preferred powder is a Type 6 powder, i.e., a powder with a size distribution primarily between about 10 microns and about 20 microns. An electrical charge is imparted to this powder, or to particles or spheres that are used, to make it electrokinetic by coating it with a charge control material. This involves, for example, first spray coating the powder with a dielectric polymer material such as Joncryl 682 available from Johnson Polymer of Sturdevant, Wis. The purpose of the dielectric polymer is to provide a very acidic or hydroxyl surface with which the subsequently applied charge director can chemically react. The coated powder is subsequently wetted with a liquid having suitable dielectric properties, such as Isopar-G available from Exxon Mobil. Another suitable liquid is a product available from 3-M Corporation under the trade name Fluorinert. The powder constitutes about 0.5 to about 50 wt. % of the powder/liquid mixture, and about 1 to about 20 vol. % of the powder/liquid mixture. A charge control material such as poly lecitin charge director is then added to this mixture in an amount between about 10 and 20,000 microliters charge control material per liter Isopar.

In one embodiment barium petronate modified by perfusion with distilled water is employed as the charge director. It has been discovered that barium petronate has an advantage that it allows the deposition to be self-limiting, and therefore more controllable. In particular, most charge directors such as poly lecitin detach from the particles and dissipate into the solution after the particles are deposited on the substrate. Barium petronate, in contrast, remains on the particles. As such, the barium petronate charge on deposited particles balances out the electrostatic or electrokinetic deposition driving forces locally at the substrate. As deposition advances, the driving force is eventually balanced by the deposited charge. In this way the deposition can be controlled by controlling the quantity of barium petronate charge director mixed into the solution; or the voltage (or charge level) of the imaging tool.

Another advantage of barium petronate as the charge director is that it can be used on uncoated particles. In particular, it is not necessary to first coat the particles with a dielectric polymer because the barium petronate attaches itself to the bare metal surfaces.

Alternative materials and methods for particle preparation are disclosed in the U.S. Patent Application filed Jul. 9, 2004 entitled COATING METAL POWDERS, the entire disclosure of which is expressly incorporated herein by reference.

Varied Thickness Solder Bumps

In some applications, it may be desirable to create solder bumps with varying thicknesses on the same substrate. For example, a mixed-component printed wiring board requires solder bumps of differing thicknesses for each of the individual types of components. To create such a solder bump variation, the area of the hole around the substrate features is reduced to obtain solder bumps of lower height.

Edge Effect

In connection with the present process, and in connection with other metal powder deposition processes, there can be a so-called "edge effect" around the periphery of the metallization. More particularly, an edge effect often occurs at the periphery of metallization. This edge effect consists of a non-uniform band of overdeposit of metal powder at the peripheral areas of metallization. The edge effect is attributed to the fact that the electrical field is much stronger at the periphery because there is a relatively larger build up of corona charge on the relatively larger continuous area of non-conducting, e.g., polymer layer outside this periphery. Because the force of the electrical field is a function of the electrical field times the charge, (F=Exq), the force at the periphery is greater because the field's magnitude is greater there. In the direct electrostatic deposition mode of the invention, corona charge build-up is that charge imparted by the corona generator that produces field lines directing the powder to the substrate.

Figure 21:
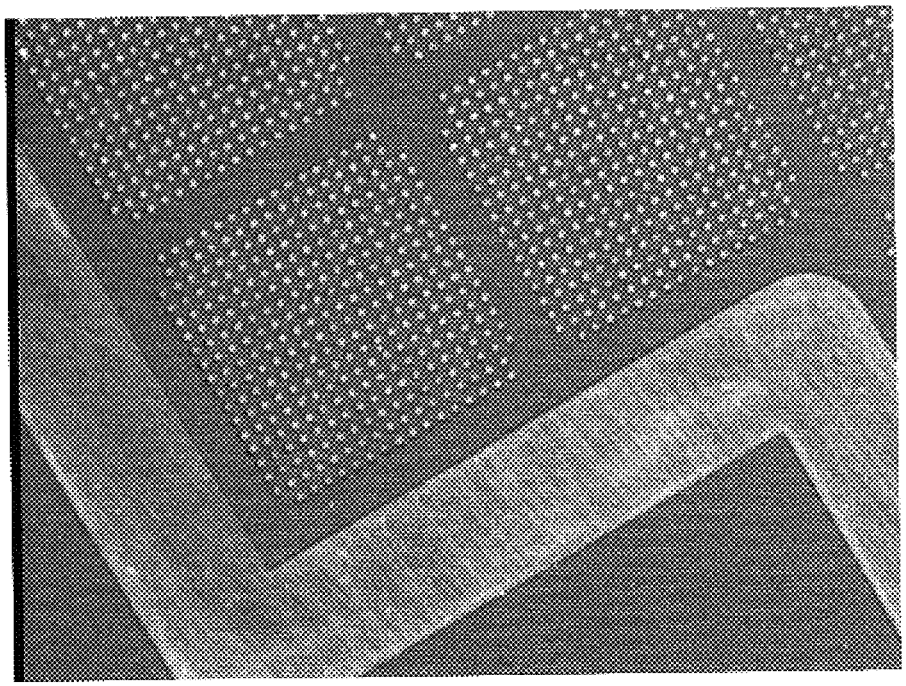
FIGS. 21-24 are photographs of wafers illustrating applicants method for addressing edge effect.
Figure 22:
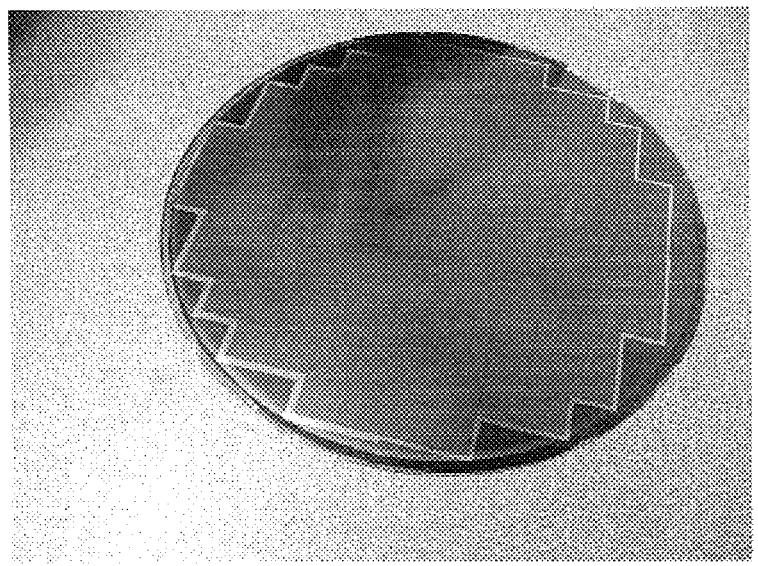
Figure 23:
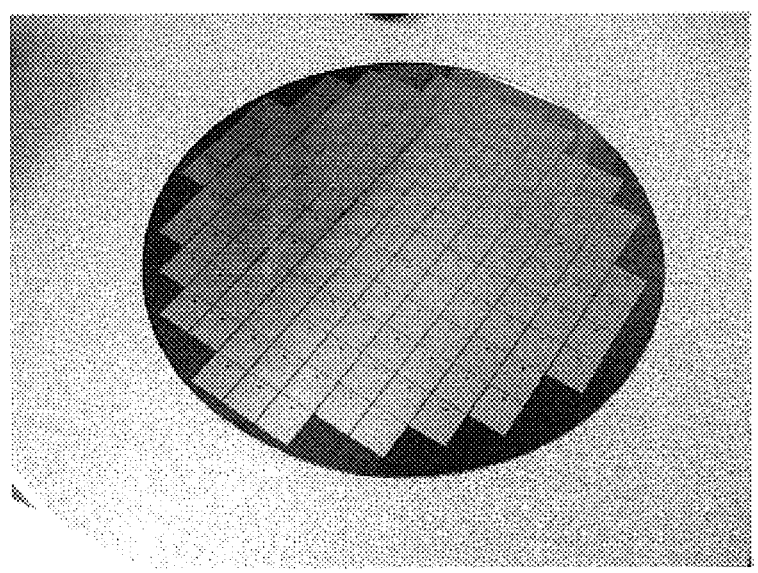
Figure 24:
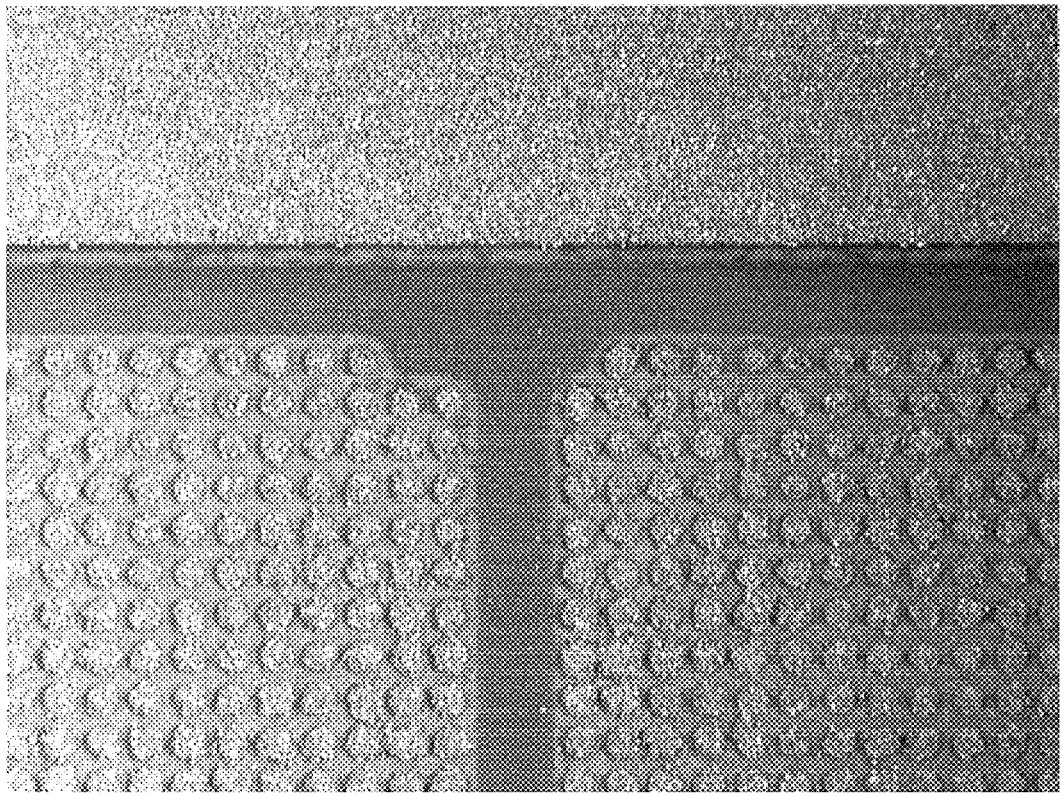

To substantially reduce or eliminate the edge effect, the invention may include formation of a more or less continuous band of exposed metallization outside of the service area of the substrate and adjacent to the periphery of the grid or other pattern of exposed metallization, as illustrated in FIGS. 21 and 22 (compare to FIG. 23, which lacks this band. This band is formed at the same time and in the same manner of masking, curing, and developing as the pattern of non-conducting layer and exposed metallization is formed. This band interrupts what would otherwise be build up of excess corona charge at the periphery by dissipating such charges, and therefore prevents the formation of too strong an electrical field at the periphery. Deposits lacking edge effect as shown in FIG. 24 are thereby produced. In this manner, therefore, the invention involves a substrate having a band of exposed metallization on a non-service surface of the substrate for purposes of charge dissipation to inhibit edge effect.

Direct Writing

A further embodiment of the invention employs a charged substrate created by a direct writing process. Direct writing can occur in two ways: a) a charged Si plate can be discharged by a single pass of a laser beam, or b) an uncharged plate can be exposed by a stronger laser beam imparting a pattern of latent conductivity to the plate which is now selectively charged by a corona unit. In the latter mode, a laser impacts amorphous silicon (α-silicon), the amorphous silicon becomes electrically conducting. An electrically conducting pattern is drawn on an amorphous silicon substrate by a laser. A corona charge generator with a potential of, for example, about 5 to about 6 kilovolts is passed near the amorphous silicon to impart a corona charge to the non-conducting areas. Particles are then transferred to the conducting areas by the above-described electrostatic or electrokinetic methods employing a tool, with the amorphous silicon serving as the patterned tool. In particular, the patterned Si tool is presented to a source of charged particles and the charged particles are deposited on the Si according to the pre-written pattern. The process is maskless in that the pattern is defined by the conducting and non-conducting areas of the tool rather than by a separate mask. The particles are transferred from the amorphous Si to the substrate in the same pattern. In particular, the amorphous silicon tool is brought into contact with the substrate, and the particles transferred by electrical attraction, i.e., Cu having the substrate at a lower charge potential than the tool. Alternatively, the hot transfer technique described below may be used.

Hot Transfer Technique

The electrostatic and electrokinetic methods employing a tool and the direct writing method as described above involve transfer of particles from the tool to the substrate by placing the tool with particles thereon over the substrate surface to be patterned, with a gap of between 100 and about 500 microns separating the substrate from the tool surface. Due to the lower charge potential of the substrate as compared to the tool, the particles transfer to the substrate, retaining the same pattern they defined on the tool surface. As an alternative transfer technique, a hot transfer technique has been developed as a component of this invention. After the particles are patterned onto the tool, the tool is subjected to a partial reflow operation to releasably attach, i.e., to further adhere, the particles to the tool. The tool with the particles thereon is then brought into contact with the substrate, with the partially reflowed particles presented above the pads on the substrate to which they are to be transferred. After patterning, the tool with the particles thereon is brought into contact with the substrate, with the partially reflowed particles presented above the pads on the substrate to which they are to be transferred. The substrate has a hot plate behind it to heat the particles, and cause them to directly partially reflow from the tool onto the substrate pads.

The following examples further illustrate the invention.

EXAMPLE 1

For preparation of a charge director, barium petronate (10 g) available from Crompton Corporation of Middlebury, Conn. (USA) is added to Isopar G (90 g) available from ExxonMobil Chemical Company of Houston, Tex. (USA) in a 200 ml beaker. The beaker is placed on a heated stir plate and heated/stirred until it reaches a temperature of 80-90 C. Highly polished water (10 g), i.e., very pure distilled water is added one drop (~16 micro-liter) at a time while the solution is continually stirred and heated. After all the water is added the solution is stirred and heated for a further one hour. The heat is then removed and stirring is continued until the solution has cooled. A tan-colored precipitate is noted to form. The mixture is aged for one day at room temperature, then filtered and the precipitate discarded.

EXAMPLE 2

For solder powder coating, Joncryl 682 resin available from Johnson Polymer, LLC of Studevant, Wis. (USA) is dissolved in methanol to a concentration of 20% then spray coated onto Type 6 Sn63Pb37 solder powder obtained from Welco GmbH, Potsdam, Germany. The spraying is achieved by a Wurster Process performed by Coating Place, Inc. of Verona, Wis. (USA).

EXAMPLE 3

For toner preparation, coated powder (120 g) is added to 1 liter of Isopar G in a 1.4 liter beaker and stirred with an appropriate mixer, such as "The Agitator" available from Victory Engineering, Hillside, N.J. (USA). Magnetic stir bars are not used because they abrade the coating off the powder. Charge director (21 drops; ~0.016 ml per drop) prepared according to Example 1 is added to the mixture and the stirring continued for at least four hours. The toner is allowed to age for two days at room temperature. The toner is protected from a high humidity environment (>60% RH) to maintain stable performance.

EXAMPLE 4

For substrate preparation, standard finished silicon wafers are given a solder wettable array of input/output pads by sputtering an appropriate under bump metallization (UBM). A typical example of this is 500 Å of tungsten, 500 Å of platinum, and 5,000 Å of gold. These UBM pads are sputtered over a blanket layer of aluminum (typically 300-500 Å) then photo-lithographically defined. The aluminum serves as an electrical ground plane. A charge retaining dielectric mask is formed over the UBM/aluminum. For example Morton-Dynachem laminar 5075 dry film solder mask is vacuum laminated to the silicon wafer with the UBM side up using an industry standard laminating machine. The film is exposed with a photo-tool and the areas around and above the UBM pads are removed photolithographically. The patterned masked wafer is washed in a 0.5% nitric acid bath then washed in DI water to remove trace amounts of alkali solution residues from the photo-development step. After drying, the mask undergoes UV exposure to complete the cross linking process. With laminar 5075 dry film this exposure is 250 milli-joules $cm^2$ in the 300-400 nm range.

EXAMPLE 5

For direct electrostatic-based deposition, the masked wafer is charged by a scorotron which scans the wafer at a speed of 125 mm/second. The front grid of the scorotron is held at −800V, while the corona wire is maintained at −6.25 kv. After charging, approximately 10 ml of toner is poured over the masked wafer which is rotated slowly (10-15 rpm) and held at an angle of 30 degrees from vertical. The wafer is vibrated by an ultrasonic probe (Delta 8935 Mk-II; available from FFR Ultrasonics Ltd. of Loughborough, UK) for 2 sec. This imaging step is repeated twice with the scorotron screen still at −800V on the second and third passes. The holes in the mask over the UBM are thereby completely filled with solder powder toner.

EXAMPLE 6

For electrokinetic-based deposition, a masked wafer identical to that of Example 5 is used as a substrate and mounted in a fixture where the wafer faces a gold coated metal plate spaced 6 mm from the surface of the wafer. The fixture is designed such that the sides are completely open so fluid flow is not impeded. The fixture allows the wafer to be rotated 180° during the imaging. A large tank (29 cm inner diameter by 27 cm deep) is filled with 17 liters of the toner of Example 3. A Victory Engineering "Agitator" stirs it from the bottom with sufficient vigor that essentially all the solder particles are levitated. The wafer is driven to a voltage of 0 to +400 V (a 200 V pk, 100 Hz triangle wave biased off ground by +200V) while the gold coated electrode is grounded. The wafer/plate fixture is immersed in the toner bath, then the voltage switched "on" for ten seconds. The wafer is then rotated and held for another ten seconds with the voltage still applied. After the two ten second periods, the voltage is switched "off" and the wafer/plate assembly is held in the tank for 5 seconds before it is removed. This 5 second "wash" interval is useful in cleaning residual toner particles from unwanted regions of the mask (known as "background" particles in the imaging industry). The holes in the mask are thereby completely filled with solder powder toner.

EXAMPLE 7

For imaging using a transfer tool, an imaging plate is made identical to the masked wafer of Example 5, except that the substrate, being reusable, is a material such as ITO coated glass or a metal coated glass epoxy board, which is more durable. The dielectric material itself is a borosilicate glass (e.g, Pyrex available from Corning Inc. of Acton, Mass., USA; or Borofloat available from Shott North America, Inc. of Elmsford, N.Y., USA) that is ultrasonically patterned or chemically etched. The imaging tool is charged by a scorotron to a surface charge density equivalent to −500 to −1000V. Toner (10 ml) of Example 3 is dispensed over the tool as in Example 5. A filled image is thereby created on the re-usable tool. A receiving substrate, which is an unmasked but UBM processed wafer (Example 4), is connected to a voltage equal to that of the imaging tool (in this case −500 to −1000 V), and then brought into virtual contact with the still wet imaging tool. The receiving substrate is not wetted with toner liquid before contact as excess liquid severely degrades image quality. The voltage on the receiving substrate is subsequently dropped to zero or even slightly positive and the receiving substrate is withdrawn from contact with the imaging tool. A good, clean image is thereby formed on the receiving substrate.

EXAMPLE 8

For imaging using a transfer tool by an alternative embodiment, the re-usable image tool is made of a patterned dielectric layer, such as a 125 micron thick polyimide layer with a 17 micron copper layer on both sides. The polyimide material is PYRALUX available from DuPont Inc., Wilmington, Del.). In this case the tool is laser cut "through" for easily cleaning of the tool. The re-usable tool is mounted on a suitable chuck with the bottom metal layer at ground and the top connected to a high voltage power supply (type −1000 to −2000V). Toner (10 ml) of Example 3 is used to develop the tool, one or more times, then a transfer step as in Example 7 deposits the image on the receiving substrate.

EXAMPLE 9

For creating an imaging tool by direct laser writing, a flat, amorphous silicon plate manufactured by Kyocera Corp of Japan is charged to −1000 V. An LED array and a strip lens assembly are scanned across the plate to discharge it in an image wise fashion. It is then developed as in Example 5, but only one time. The wet image is dried and gently baked at 100° C. for 2 minutes. An unmasked but UBM processed wafer as in Example 4 is mounted on a heated chuck which brings the wafer to 250° C. The dried plate is sprayed with flux Alpha Metal #3355 (Cookson Electronics, Inc., Jersey City, N.J., USA) which is then dried. The receiving wafer is brought into contact with the fluxed image where heat from the wafer melts the solder powder which selectively wets the UBM of the wafer.

Although the methods and materials of the invention are described above chiefly in the context of applying metal particles to substrates, the methods and materials are applicable to deposition of non-metal particles as well, provided the nature of the particles is such that they can be imparted with an electrochemical charge. Examples of such processes involving non-metal powders include deposition of phosphors, glasses, ceramics, semiconductor materials such, e.g., for use in flat panel displays or the like.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense. The foregoing relates to a limited number of embodiments that have been provided for illustration purposes only. It is intended that the scope of invention is defined by the appended claims and there are modifications of the above embodiments that do not depart from the scope of the invention.

What is claimed is:

1. A method for applying a pattern of particles to a substrate having masked surfaces and unmasked surfaces, the method comprising:
    applying an electrostatic charge to at least some of the masked surfaces of the substrate to yield charge-holding masked surfaces; and
    exposing the substrate with the charge-holding masked surfaces thereon to the particles in a fluid medium in which the particles are mobile, which particles have an electrochemical charge of the same polarity as the charge on the charge-holding masked surfaces, thereby electrostatically depositing the particles onto the unmasked surfaces of the substrate;
    wherein said exposing the substrate to the particles in the fluid medium comprises immersing the substrate in a slurry of metal particles or flowing a metal particle solution across the top of the substrate.

2. The method of claim 1 comprising connecting the unmasked surfaces to electrical ground during the exposing the substrate to the particles.

3. The method of claim 1 comprising:
    after exposing the substrate to the particles, repeating the step of applying the charge to regenerate charge on the masked surfaces; and
    repeating the step of exposing the substrate to the particles to deposit additional particles onto the particles previously deposited onto the unmasked surfaces of the substrate to thereby achieve stepwise deposition of the metal particles onto the substrate.

4. The method of claim 1 comprising vibrating the substrate during the exposing the substrate to the particles.

5. The method of claim 1 wherein the substrate has a band of exposed metallization on a non-service surface of the substrate for purposes of charge dissipation to inhibit edge effect.

6. The method of claim 1 wherein the substrate is an electronic device substrate, said applying comprises applying said electrostatic charge to at least some of the masked surfaces of the electronic device substrate and said exposing comprises immersing the electronic device substrate in said slurry of metal particles or flowing said metal particle solution across the top of the electronic device substrate.

7. The method of claim 1 wherein the metal particles are solder metal particles and the method further comprises subjecting the deposited particles to reflow.

8. A method for applying a pattern of particles to a substrate having masked surfaces and unmasked surfaces, the method comprising:
    applying an electrostatic charge to at least some of the masked surfaces of the substrate to yield charge-holding masked surfaces; and
    exposing the substrate with the charge-holding masked surfaces thereon to the particles in a fluid medium in which the particles are mobile, which particles have an electrochemical charge of the same polarity as the charge on the charge-holding masked surfaces, thereby electrostatically depositing the particles onto the unmasked surfaces of the substrate; and
    connecting the unmasked surfaces to an electrochemical potential which facilitates said depositing during the exposing the substrate to the particles.

9. The method of claim 4 wherein the substrate is an electronic device substrate, and said applying comprises applying said electrostatic charge to at least some of the masked surfaces of the electronic device substrate.

10. The method of claim 4 wherein the substrate is an electronic device substrate, said applying comprises applying said electrostatic charge to at least some of the masked surfaces of the electronic device substrate and said exposing comprises immersing the electronic device substrate in a slurry of metal particles or flowing a metal particle solution across the top of the electronic device substrate.

11. A method for applying a pattern of particles to an electronic device substrate having under bump metallization, masked surfaces, and unmasked surfaces, the method comprising:
    applying an electrostatic charge to at least some of the masked surfaces of the electronic device substrate to yield charge-holding masked surfaces; and
    exposing the electronic device substrate with the charge-holding masked surfaces thereon to the particles in a fluid medium in which the particles are mobile, which particles have an electrochemical charge of the same polarity as the charge on the charge-holding masked surfaces, thereby electrostatically depositing the particles onto the unmasked surfaces of the substrate.

12. The method of claim 11 wherein the masked surfaces comprise polymer mask surfaces in a pattern over the under bump metallization, and the unmasked surfaces comprise exposed under bump metallization not covered by the polymer mask surfaces.

13. The method of claim 12 wherein the particles comprise solder metal particles, the method comprising:
applying the electrostatic charge to at least some of the polymer mask surfaces of the substrate by passing a corona charge generator near said at least some of the polymer mask surfaces to yield the charge-holding masked surfaces; and exposing the substrate with the charge-holding masked surfaces thereon to the solder metal particles in a dielectric fluid medium in which the solder metal particles are mobile, which solder metal particles have said electrochemical charge of the same polarity as the charge on the charge-holding masked surfaces, thereby electrostatically depositing the solder metal particles onto the exposed under bump metallization.

14. The method of claim 13 comprising connecting the under bump metallization to electrical ground during the exposing the substrate to the solder metal particles in the dielectric fluid medium.

15. The method of claim 14 comprising vibrating the substrate during the exposing the substrate to the solder metal particles.

16. The method of claim 13 comprising connecting the under bump metallization to an electrochemical potential which facilitates said depositing during the exposing the substrate to the solder metal particles in the dielectric fluid medium.

17. The method of claim 12 wherein the particles comprise solder metal particles, the method comprising:
applying the electrostatic charge to at least some of the polymer mask surfaces of the substrate by passing a corona charge generator near said at least some of the polymer mask surfaces to yield the charge-holding masked surfaces;
exposing the substrate with the charge-holding masked surfaces thereon to the solder metal particles in a dielectric fluid medium in which the solder metal particles are mobile, which solder metal particles have said electrochemical charge of the same polarity as the charge on the charge-holding masked surfaces, thereby electrostatically depositing the solder metal particles onto the exposed under bump metallization;
repeating the step of applying the electrostatic charge to at least some of the polymer mask surfaces of the substrate by passing the corona charge generator near said at least some of the polymer mask surfaces to regenerate a charge on the charge-holding masked surfaces; and
repeating the step of exposing the substrate with the charge-holding masked surfaces thereon to the solder metal particles in the dielectric fluid medium in which the solder metal particles are mobile, which solder metal particles have said electrochemical charge of the same polarity as the charge on the charge-holding masked surfaces, thereby electrostatically depositing additional solder metal particles over the solder metal particles deposited onto the exposed under bump metallization.

18. The method of claim 17 comprising connecting the under bump metallization to electrical ground during the exposing the substrate to the solder metal particles in the dielectric fluid medium and during the repeating the step of exposing.

19. The method of claim 17 comprising connecting the under bump metallization to an electrochemical potential which facilitates said depositing during the exposing the substrate to the solder metal particles in the dielectric fluid medium and during the repeating the step of exposing.

20. The method of claim 17 comprising vibrating the substrate during the step of exposing the substrate to the solder metal particles and during the step of repeating the exposing.

21. The method of claim 12 wherein the particles comprise solder metal spheres having an average diameter of at least about 100 microns, the method comprising:
applying the electrostatic charge to at least some of the polymer mask surfaces of the substrate by passing a corona charge generator near said at least some of the polymer mask surfaces to yield the charge-holding masked surfaces; and
exposing the substrate with the charge-holding masked surfaces thereon to the solder metal spheres in a dielectric fluid medium in which the solder metal spheres are mobile, which solder metal spheres have said electrochemical charge of the same polarity as the charge on the charge-holding masked surfaces, thereby electrostatically depositing the solder metal spheres onto the exposed under bump metallization.

22. The method of claim 21 comprising connecting the under bump metallization to electrical ground during the exposing the substrate to the solder metal spheres in the dielectric fluid medium.

23. The method of claim 21 comprising connecting the under bump metallization to an electrochemical potential which facilitates said depositing during the exposing the substrate to the solder metal spheres in the dielectric fluid medium.

24. The method of claim 21 comprising vibrating the substrate during the exposing the substrate to the solder metal spheres.

25. The method of claim 11 wherein the substrate has a band of exposed metallization on a non-service surface of the substrate for purposes of charge dissipation to inhibit edge effect.

26. A method for applying a pattern of particles to a substrate having masked surfaces and unmasked surfaces, the method comprising:
inducing an electrostatic charge to at least some of the masked surfaces of the substrate to yield charge-holding masked surfaces;
exposing the substrate with the charge-holding masked surfaces thereon to the particles in a fluid medium in which the particles are mobile, which particles have an electrochemical charge of the same polarity as the charge on the charge-holding masked surfaces;
immersing a counter-electrode in the fluid medium and wherein the unmasked portions of the substrate constitute an electrode; and
attaching the electrode and counterelectrode to opposite poles of a voltage supply to establish an electrochemical potential between the counter electrode and the electrode and thereby electrokinetically depositing the particles on the unmasked portions of the substrate constituting the electrode.

* * * * *